(12) United States Patent
Varney

(10) Patent No.: US 7,146,584 B2
(45) Date of Patent: Dec. 5, 2006

(54) SCAN DIAGNOSIS SYSTEM AND METHOD

(75) Inventor: Robert Varney, Oak Park, CA (US)

(73) Assignee: Teradyne, Inc., Boston, MA (US)

( * ) Notice: Subject to any disclaimer, the term of this patent is extended or adjusted under 35 U.S.C. 154(b) by 790 days.

(21) Appl. No.: 10/003,982

(22) Filed: Oct. 30, 2001

(65) Prior Publication Data

US 2003/0084413 A1 May 1, 2003

(51) Int. Cl.
*G06F 17/50* (2006.01)

(52) U.S. Cl. .................................. 716/4; 716/2; 716/3

(58) Field of Classification Search ................ 714/4, 714/724, 741; 716/1–3, 4, 5–15; 702/119, 702/118
See application file for complete search history.

(56) References Cited

U.S. PATENT DOCUMENTS

| | | | |
|---|---|---|---|
| 5,845,234 A * | 12/1998 | Testa et al. | 702/119 |
| 5,974,248 A * | 10/1999 | Graef | 395/500 |
| 6,067,652 A * | 5/2000 | Fusco et al. | 714/741 |
| 6,088,712 A | 7/2000 | Huang et al. | |
| 6,134,689 A | 10/2000 | Mateja et al. | |
| 6,185,707 B1 * | 2/2001 | Smith et al. | 714/724 |
| 6,205,407 B1 * | 3/2001 | Testa et al. | 702/119 |
| 6,212,666 B1 | 4/2001 | Gohl et al. | |
| 6,266,630 B1 | 7/2001 | Garcia-Sabiro et al. | |
| 6,453,437 B1 * | 9/2002 | Kapur et al. | 714/741 |
| 2002/0010560 A1 * | 1/2002 | Balachandran | 702/118 |
| 2003/0093729 A1 * | 5/2003 | Suzuki et al. | 714/724 |

* cited by examiner

*Primary Examiner*—Jack Chiang
*Assistant Examiner*—Magid Y. Dimyan

(57) ABSTRACT

A scan diagnosis system for testing and diagnosing a device-under-test is disclosed. The system includes a semiconductor tester adapted for coupling to the device-under-test and operative to generate pattern signals in the ATE domain to test the device-under-test and produce test output data in the ATE domain. An ATPG diagnosis tool is operative to generate ATPG pattern data and ATPG results data in the ATPG domain. A translator serves to effect automatic correlation of data between the ATPG domain and the ATE domain to allow data communication between the tester and the tool.

16 Claims, 8 Drawing Sheets

SCAN DIAGNOSIS SYSTEM AND METHOD

FIELD OF THE INVENTION

The invention relates generally to automatic test equipment and more particularly a DFT result diagnosis system and method for designing, testing and diagnosing semiconductor devices.

BACKGROUND OF THE INVENTION

Conventional automatic test equipment (ATE) tests semiconductor devices using the functional test approach. The goal of the functional test approach is to verify that the device performs its intended function under a variety of realistic operating conditions. Use of the functional test approach typically requires the generation of functional test patterns which exercise the device through its external interface.

However, as device complexities and densities increase, the cost of the conventional functional test approach can increase dramatically. In particular, the volume of functional test pattern data required to achieve acceptable fault coverage may increase exponentially with the size of the device. To offset these costs, many semiconductor manufacturers have looked towards structured design-for-testability (DFT) methods. With structured DFT methods the goal changes from verification of functionality to finding manufacturing defects. These methods generally rely on additional circuitry provided on the device to enhance the controllability and observability of the internal state of the device. Examples of DFT methods include scan testing, built-in-self-test (BIST), and core test (embedded microprocessor cores, etc.).

"Scan testing" is one common DFT method which has been used to test semiconductor devices and printed circuit boards for many years. With scan testing, "scan chains" (serially connected chains of storage cells) are inserted into the design. To test such a device, signals are first shifted serially into the device through the primary input pins to initialize the cells in the scan chain. Then the device is clocked for some number of cycles to propagate each scan cell's value into the adjacent combinational logic, after which the output of that logic is recaptured into the scan chain. Finally, the scan chain contents are serially shifted out of the device through its primary output pins and compared to expected values. From a test generation perspective, the effect of this approach is to make a sequential design appear like a combinational design with a larger number of pins, as scan cells behave effectively as pseudo inputs and outputs.

Nowadays, the generation of scan test patterns is performed by automatic test pattern generation (ATPG) tools. ATPG tools use knowledge of the device design and available scan chains to generate patterns which target specific faults. This is in contrast with the functional test pattern generation approach, which generally produces test patterns to exercise device behaviors and later performs a fault coverage tool check to see which faults the patterns detect.

Some ATPG tools are also capable of performing diagnosis, which is essentially the reverse of the pattern generation process. To perform diagnosis, the ATPG tool reads a list of observed scan cell failures for a given pattern and determines a gate or set of gates which would explain the failures if those gates had certain manufacturing defects.

However, to make use of these tools, the device must generally be tested using the ATPG patterns, and the failures captured on the tester must somehow be routed back to the diagnosis tool. At a minimum, this often requires pattern conversion (converting the ATPG pattern into a manufacturing tester pattern) and result conversion (converting the output of the manufacturing tester into a format readable by the diagnosis tool). Pattern conversion involves translation from the ATPG pattern format (usually STIL or WGL for scan patterns) into the proprietary test pattern format of the manufacturing tester. Result conversion involves translation from the domain of failing ATE pattern names and addresses to the domain of failing scan cells relative to ATPG pattern names. Therefore, result translation generally requires some knowledge of how the ATPG patterns were translated into manufacturing test patterns, thus complicating the process.

Once results are converted into the appropriate form for the diagnosis tool, the diagnosis tool can be invoked to perform diagnosis on the scan failures, producing logical defect data. From this point on, other available tools may be used to translate the logical defect data into the physical locations of the defects, and then to analyze the physical failures at these locations to determine the underlying causes and possible remedies.

For example, Maier and Smith describe an improved diagnostic process in their article entitled "A New Diagnostic Methodology." Their process first involves translation of logical diagnosis results such as produced by the process described here into physical locations which can then be combined with in-line electrical test data such as that produced by optical inspection equipment. By correlating test failures to physical defects, they allegedly reduce the number of hardware samples submitted to failure analysis technicians. This allegedly reduces the normally long turnaround time it takes to get feedback from diagnostic data. The specific mapping tools described include a wafermap tool which overlays electrical test data with optical inspection data. Additionally, a per-die layout-oriented mapping tool is provided to support the accumulation of multiple data sets to identify "hot spots" in the device design.

While the conventional techniques described above are beneficial for their intended purposes, the lack of automation between the ATE and the diagnosis tool is problematic. Existing pattern conversion tools are not integrated with the result translation process, so existing result translation solutions generally embed knowledge about the particular ATPG/diagnosis tool, pattern conversion tool, ATE, test program, andlor device and must therefore be modified when any of these changes. Moreover, the failure data identified and processed is typically not readily user-comprehensible. The DFT result diagnosis system and method of the present invention addresses these problems.

SUMMARY OF THE INVENTION

The DFT result diagnosis system and method of the present invention provides a unique automated and visual approach to testing semiconductor devices with ATE and DFT tools. This minimizes diagnosis time for devices-under-test, thereby optimizing the design-to-production timetable for semiconductor devices.

To realize the foregoing advantages, the invention in one form comprises a DFT result diagnosis system. The system includes an ATE data source for providing test data in the ATE domain. An ATPG tool is operative to generate ATPG pattern data and ATPG results data in the ATPG domain. At least one translation module is provided to automatically convert data between multiple domains. Additionally, the system includes at least one function module to automatically summarize data from one or more devices or tests in one or more domains.

In another form, the invention comprises a scan diagnosis system including a test and diagnosis engine and a graphical-user-interface. The test and diagnosis engine includes a semiconductor tester and a scan diagnosis tool. The graphical-user-interface includes a generator for receiving failure scan chain data identifying failed scan chains from the test and diagnosis engine and generating graphical representations of the failed scan chains. The GUI further includes a display device coupled to receive the graphical representations from the graphical user interface. The display device is operative to display the graphical representations of the failed scan chains.

In a further form, the invention comprises a method including the steps of capturing scan failure data associated with failed scan chains from a data source; displaying a portion of the scan chains including the captured failure data; and diagnosing the scan failure data with a diagnosis tool to produce diagnosis results data.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Electronic design automation (EDA) software gives semiconductor device manufacturers a tool for troubleshooting and refining their circuit designs before entering mass production. Employing EDA tools with production-oriented ATE provides real-world test solutions not only for the pre-production stage, but also in post-production where new failures may materialize that might be indetectable through simulation alone. The present invention seamlessly integrates EDA software with the ATE software to create a DFT result diagnosis system, generally designated 20 (FIG. 1), to fully automate the process.

Figure 1:
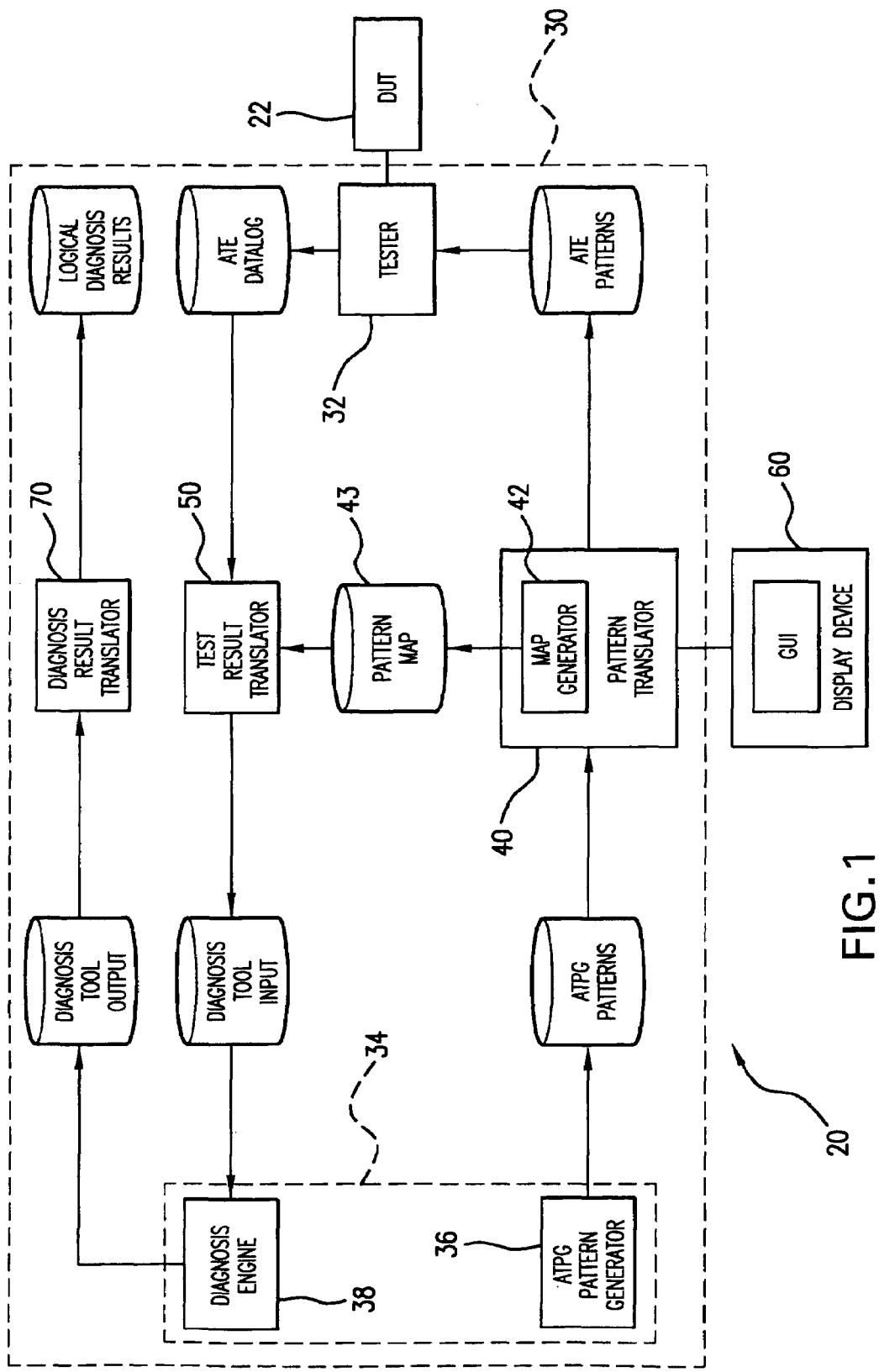
FIG. 1 is a simplified block diagram of a DFT result diagnosis system according to one form of the present invention.

Referring to FIG. 1, the DFT result diagnosis system 20, in one form comprises a scan diagnosis system that employs a test and diagnosis engine 30 that couples to a device-under-test (DUT) 22. A graphical-user-interface (GUI) 60 ties-in to the test and diagnosis engine to provide real-time visual monitoring of the various functions provided by the present invention, more fully described below.

Further referring to FIG. 1, the test and diagnosis engine 30 includes automatic test equipment (ATE) in the form of a semiconductor tester 32. The tester includes ATE-specific software for generating test vectors or patterns necessary to test the DUT 22. To take advantage of the DFT gates, or scan chains, provided on the DUT to enable scan testing, the ATE-specific software is supplemented by an EDA tool 34.

The EDA tool 34 includes a diagnosis engine 38 for evaluating converted output data from the ATE 32 for scan diagnosis. One of the benefits of the EDA tool 34, besides diagnosing scan failure data, is the ability to generate ATPG patterns that access specified scan chains disposed in the DUT 22. An ATPG generator 36 within the diagnosis tool provides this capability.

Further referring to FIG. 1, respective pattern, test and diagnosis results translator modules 40, 50 and 70 convert data used by the ATE 32 and the EDA tool 34 to provide an automatic and seamless integration between the software packages. The pattern translator module 40 performs ATPG to ATE vector conversion, and generates test patterns which may be compiled and loaded onto the ATE. The pattern translator module also includes a map generation component 42 which generates a pattern map (shown as direct data at 43) between ATE and ATPG pattern domains and also captures information describing the locations of scan load/unload sequences within the ATE/ATPG patterns.

Use of the term "domain" herein, consistent with that understood in the art, is intended to convey a type of data. For example, data in the ATE test result domain might include failing ATE patterns, failing pins, and/or failing cycles. Data in the ATPG test results domain might include failing ATPG patterns, failing ATPG pins, and so forth. Likewise, failures of DFT test structures (such as scan chains or cells), failures of logical design elements (such as gates), and failures at physical design locations also have their respective domains.

Figure 2:
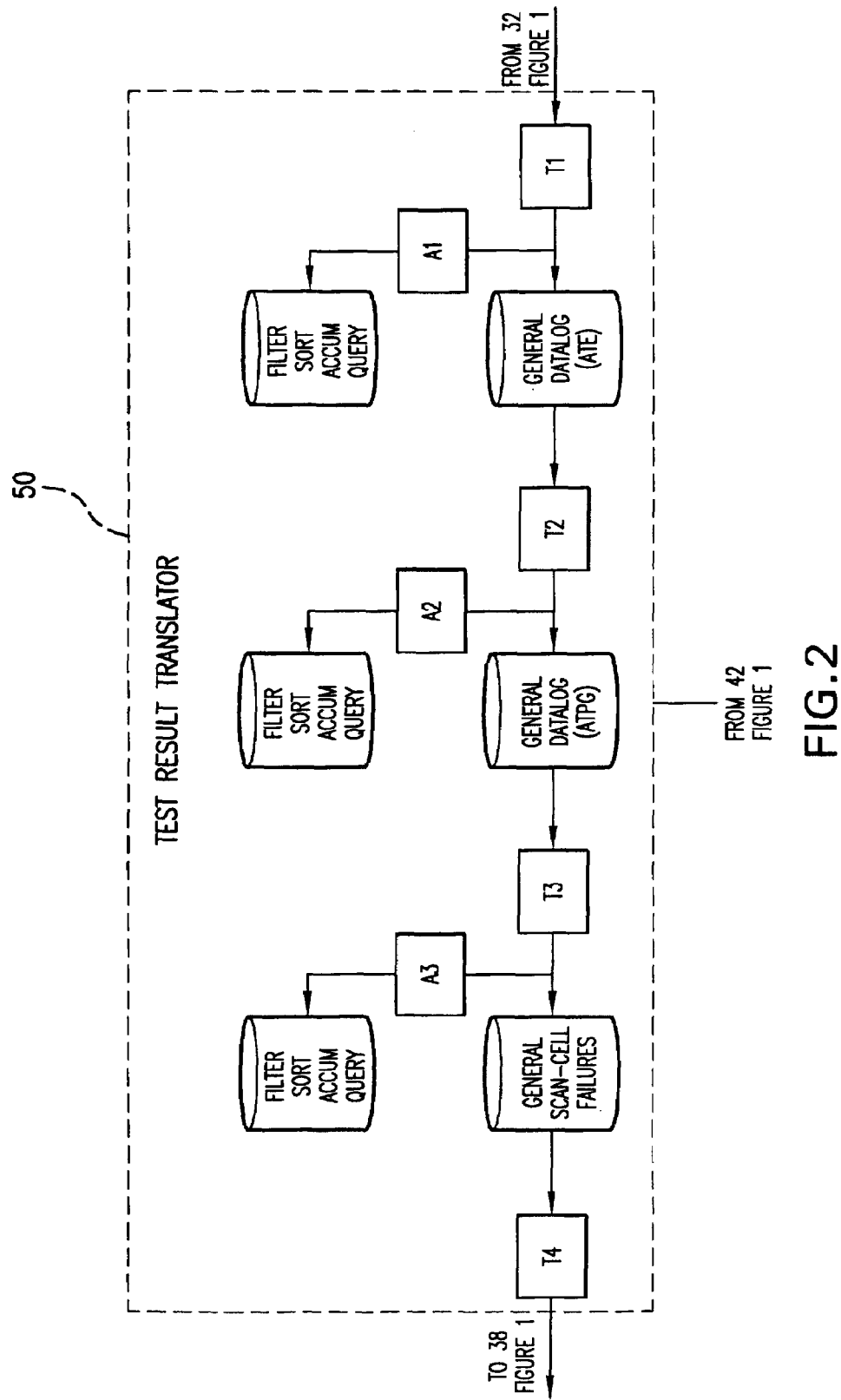
FIG. 2 is a block diagram illustrating the test result translator shown in FIG. 1.

Referring now to FIG. 2, the test result translator module 50, in further detail, includes a first converter T1, which takes the ATE-specific ASCII output data from a datalog source, such as for example the tester 32, or some other data repository, (essentially a list of failing vectors in the ATE domain indicating the failing ATE patterns, addresses, cycles, and device pins), and converts it into a general datalog format in the ATPG domain (referencing ATPG pattern names). The general datalog format combines elements of both the ATE and ATPG data formats. Additionally, correlation data from the mapping generator also feeds into the converter T1 to associate scan chain location data with the vector pattern data.

Figure 7:
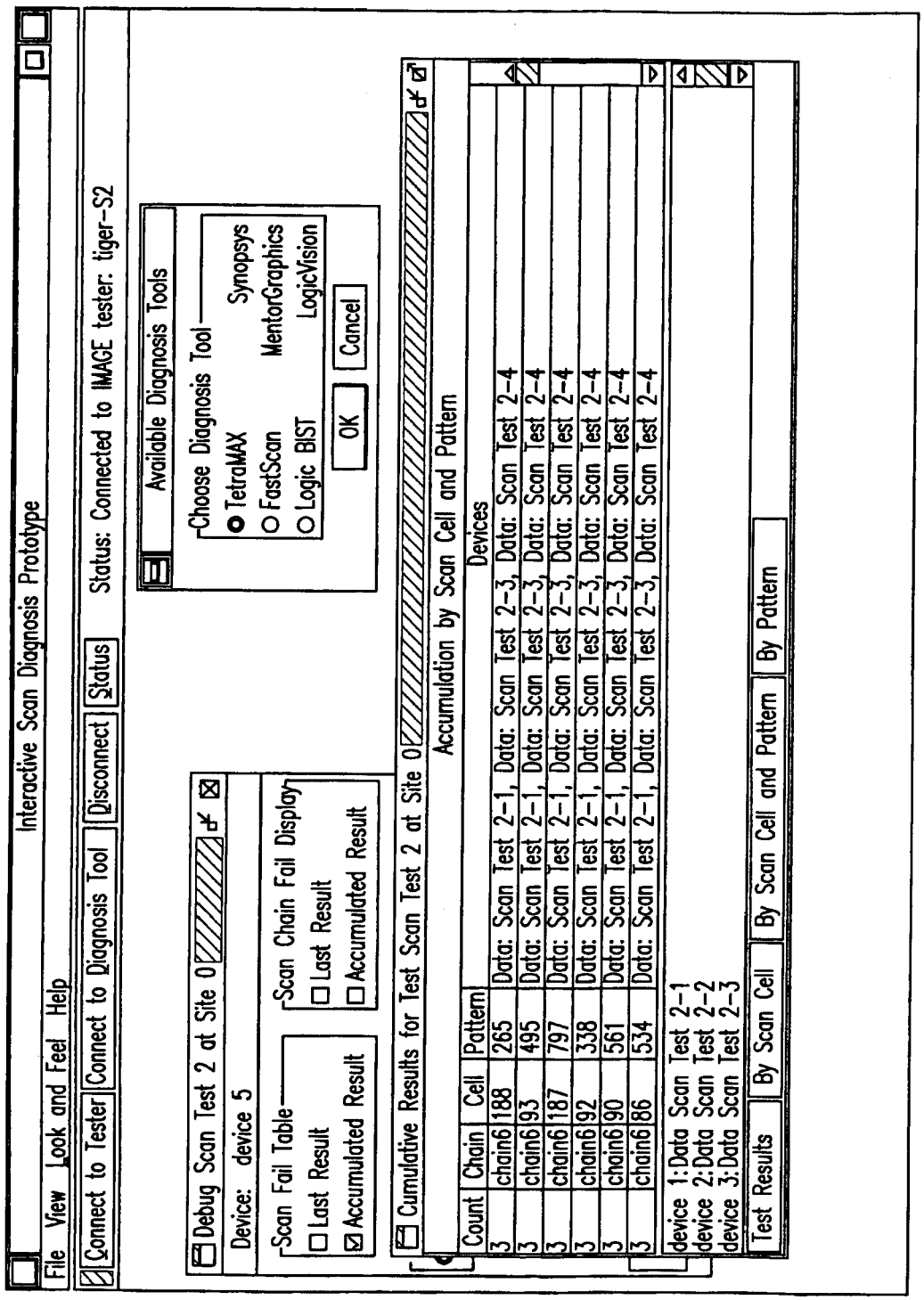
Figure 8:
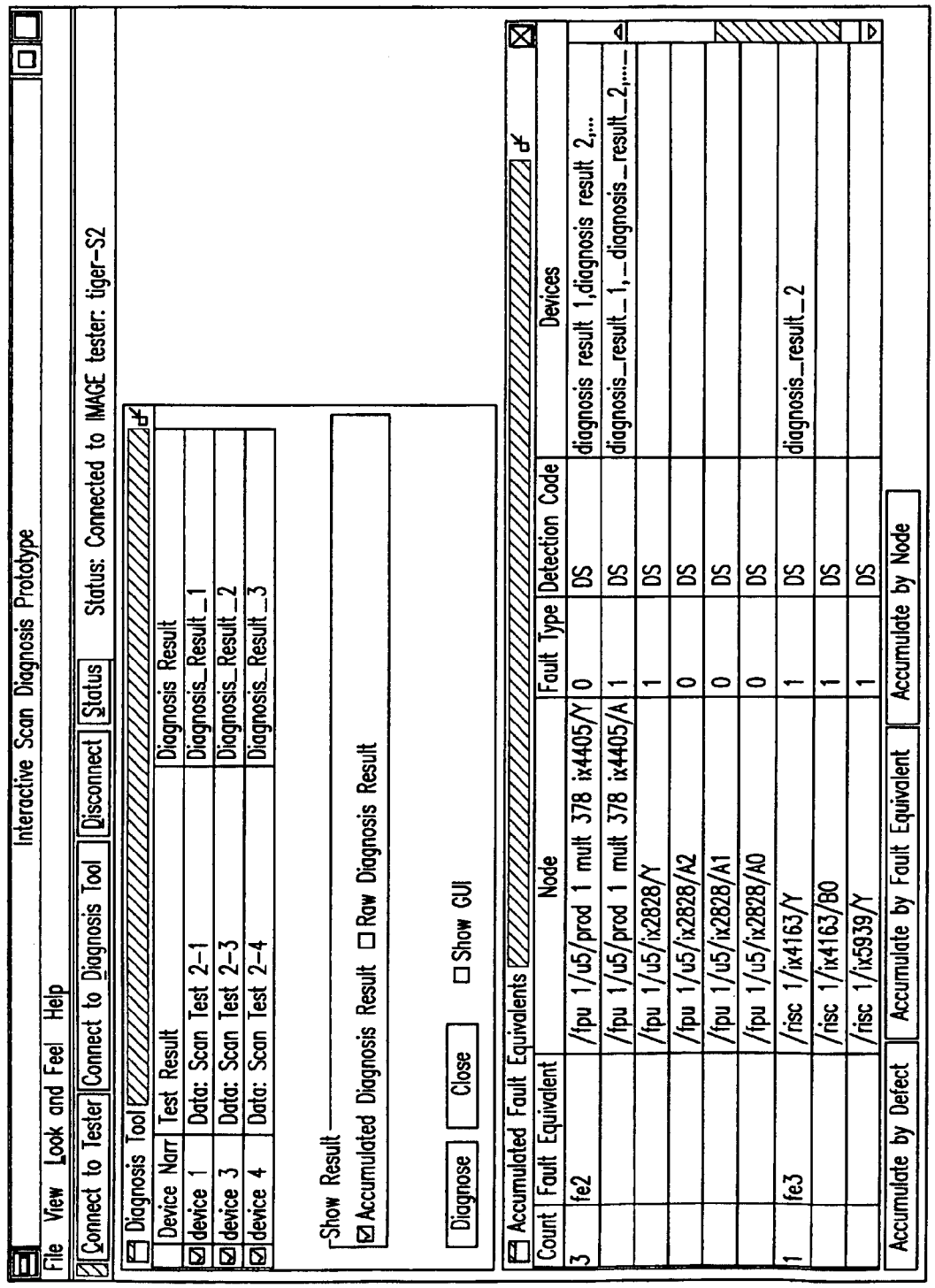

A series of functions are operable on the general datalog through the function module A1, such as filtering, sorting, accumulating and querying of data. The results of these functions, or sunimarizations, are viewable by a user through optional selection menus in the GUI 60. Filtering and sorting may involve looking at some part of the data, while excluding other portions, or subsets of the data. The accumulating function, as illustrated in FIGS. 7 and 8, gives the user the ability to look at various aspects of the data, across multiple tests (if desired) in an effort to gain a better understanding of the result interpretation. For example, a user could accumulate data across multiple tests on a device, or accumulate data from multiple devices to identify which pins, tests, scan chains, scan cells, logical design elements, and/or physical design elements are failing most frequently.

The general datalog is then converted by a second converter T2, into a general datalog domain that includes ATPG information. This data is is optionally processed through function module A2, and subject to filtering, accumulating, etc. A third conversion is performed by converter T3, where the general datalog ATPG data is transformed into scan-cell failure domain data, indicating ATPG pattern names, scan chain names, and scan cell numbers. Like the general datalog data, the general scan cell failure data is subject to processing through function module A3 (filtering, sorting, accumulating, querying) as desired. A fourth converter T4, then takes the general scan cell failure data and transforms it into a format suitable for the specific diagnosis tool employed.

Figure 3:
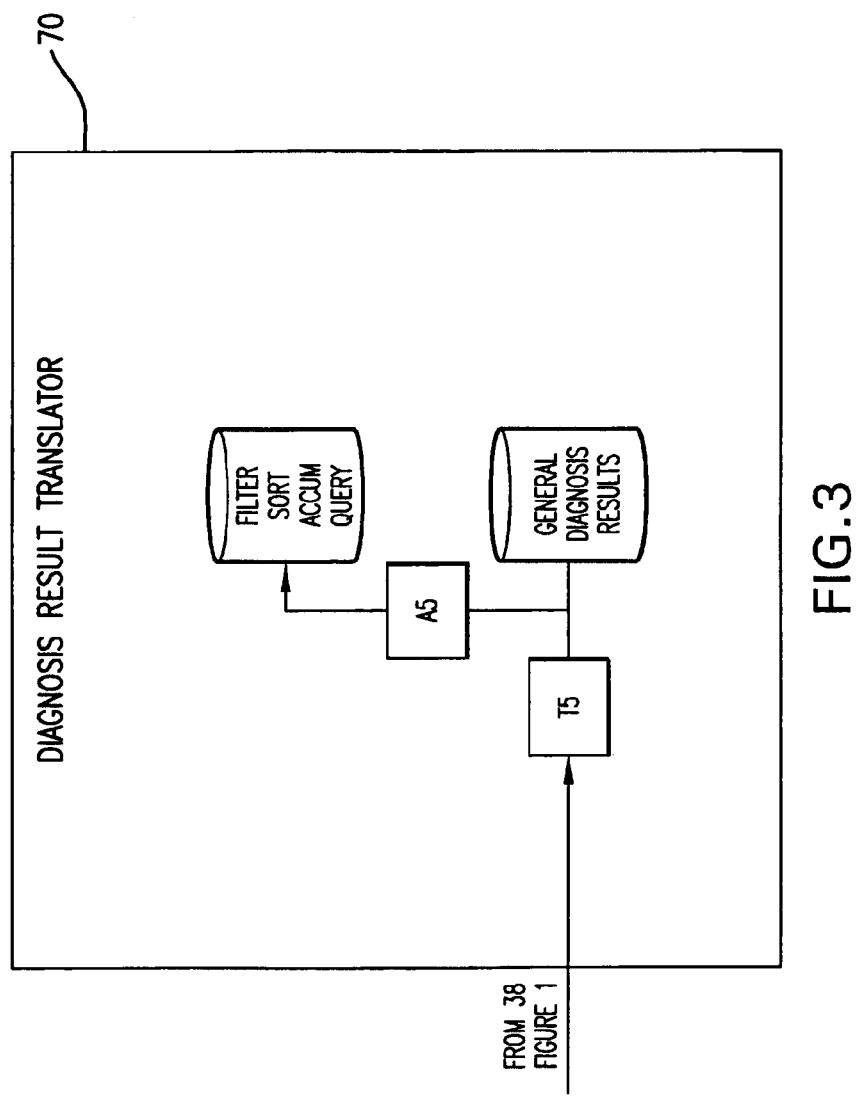
FIG. 3 is a block diagram similar to FIG. 2, illustrating the diagnosis result translator of FIG. 1.

The diagnosis result translator 70, shown in FIG. 3, feeds ATPG specific data from the diagnosis engine 38, through converter T5 to produce general diagnosis results. Function module A5 provides optional data processing functions, as desired, such as filtering, accumulating, and the like.

As noted above, processing though the test and diagnosis engine 30 is conveniently monitored by a user though menu selections on the GUI 60. The GUI includes several interactive screens (FIGS. 6 through 8) that present a user with an array of options to visualize data in any number of formats for optimal diagnosis of the data. This provides a user with maximum flexibility in determining and diagnosing problem areas in a DUT design, and can be used to reduce the volume of data which must be processed by the next step, thus reducing turnaround time. Of particular significance is the ability of the GUI to actually show sequences of scan chains for rapid evaluation by the user. This is more fully described described below.

Figure 4:
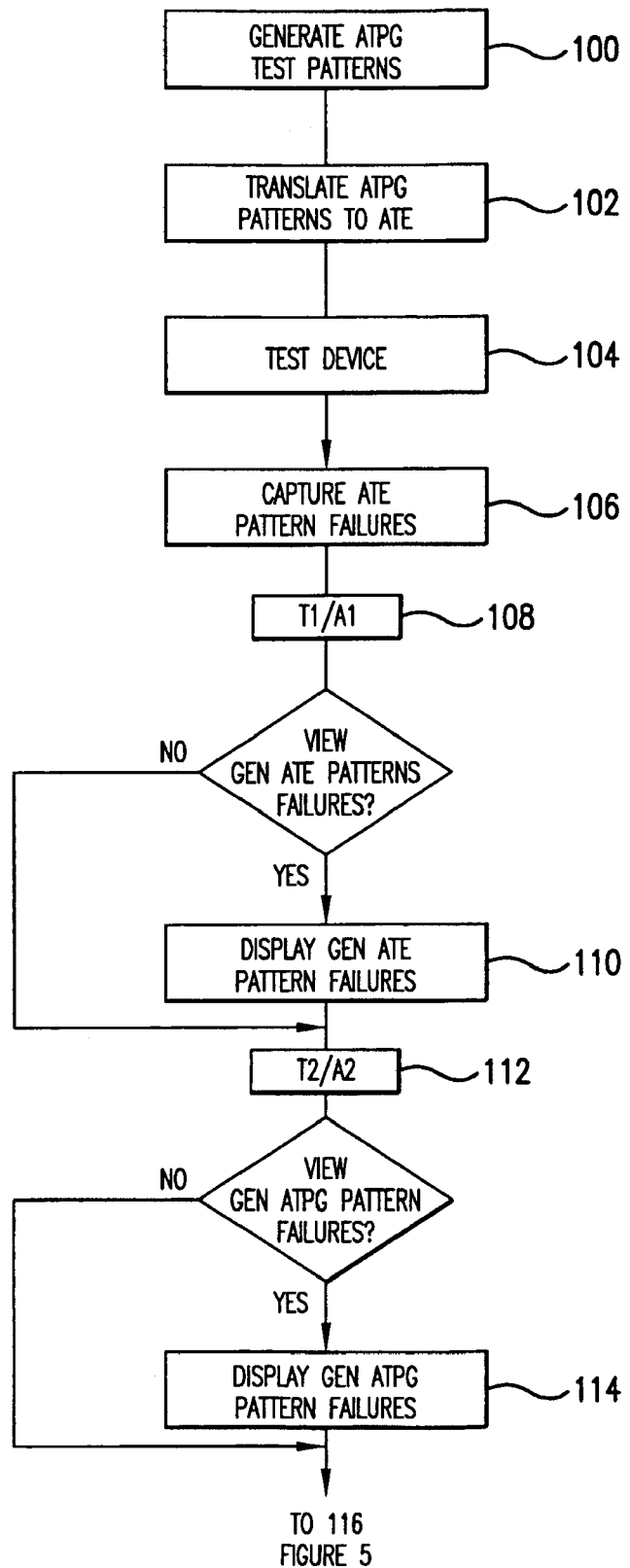
FIG. 4 is a partial flowchart illustrating the scan method of the present invention carried out by the scan system shown in FIG. 1.
Figure 5:
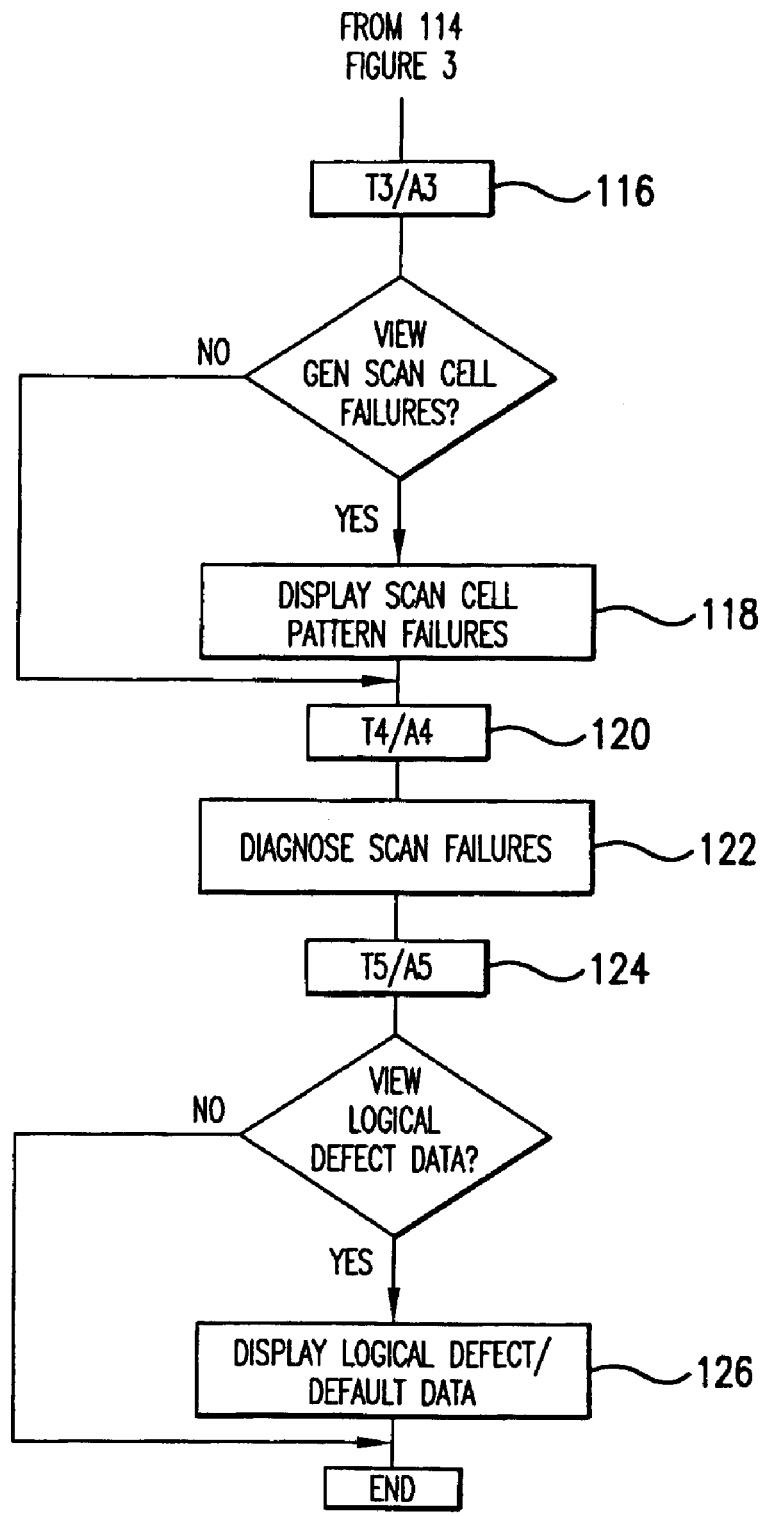
FIG. 5 is a partial flowchart of the method of FIG. 4.

In operation, the test and diagnosis engine 30 cooperates with the GUI 50 to effect automatic and seamless integration between the ATE 32 and the diagnosis tool 34. The general steps of operation are shown in the flowchart of FIGS. 4 and 5, and briefly described below.

Initially, at step 100, the diagnosis tool 34 generates ATPG test patterns designed to serially shift along the scan chains (flip-flops disposed within the DUT 22) to determine failures in areas of the device not normally accessible by conventional ATE patterns. In order to get the patterns into the device, however, they must first be translated into the appropriate ATE vector format. As noted above, this is automatically carried out by the pattern translator 40, at step 102. The ATE 32 then processes the vector data to test the DUT, at step 104, resulting in the capture of scan failure data, at step 106. The captured data is then converted and processed by converter T1 and function module A1 FIG. 2 at step 108, to produce general ATE datalog data.

Figure 6:
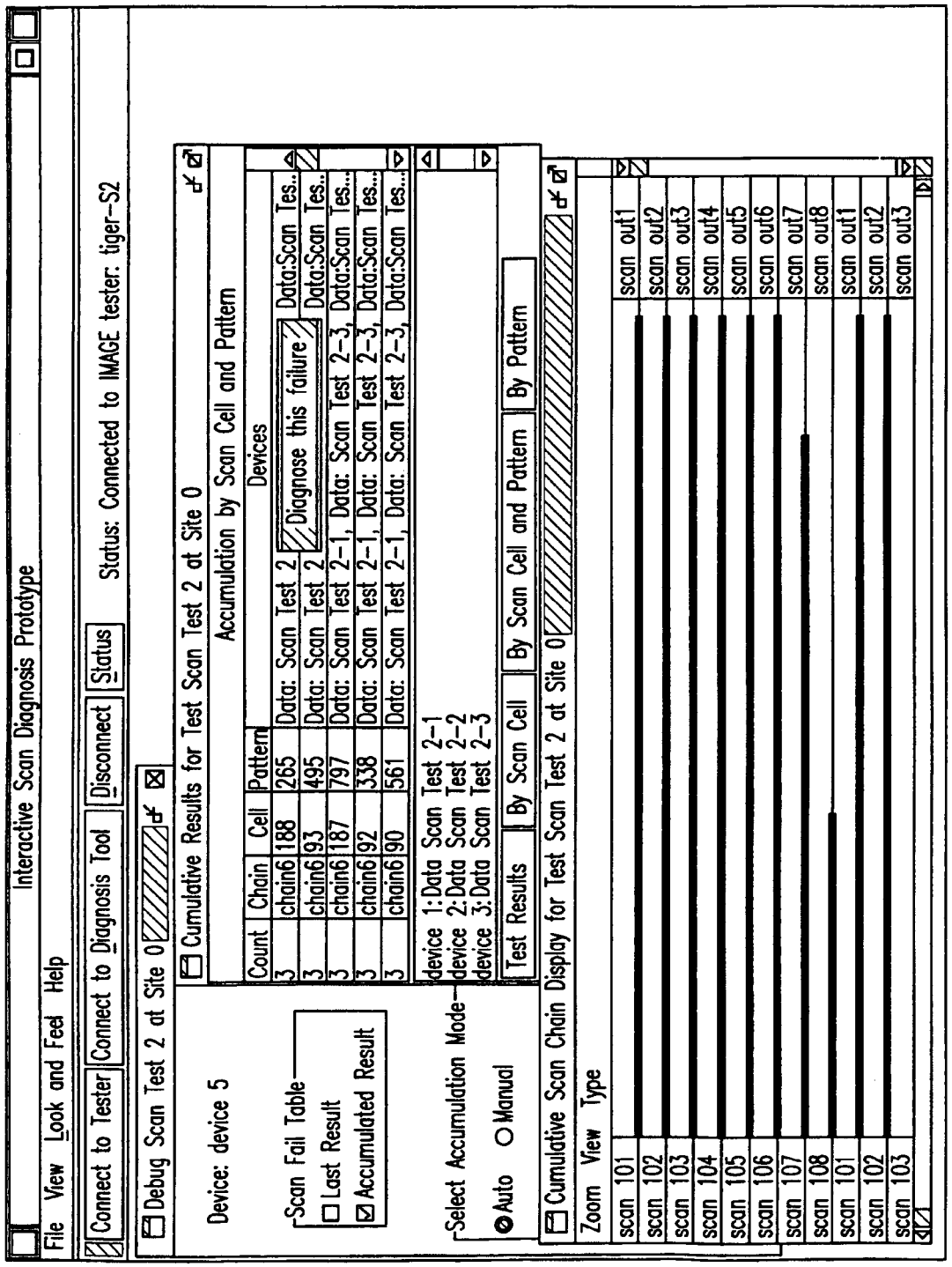
FIGS. 6–8 are screens illustrating various options and results provided by the GUI of FIG. 1.

With the scan failures detected and converted into general ATE datalog, the user may view the failure data in tabular or graphical format, at step 110, with the GUI 60. FIG. 6 illustrates an example of the GUI screen with a variety of options available to the user. Both graphical and tabular formats may be selected, with the resulting screen showing the current and/or cumulative sequence of scan chains with the failures highlighted. If multiple tests are performed on one or more devices, the user can access accumulated data to view compiled results in a variety of ways.

From this point, the user then directs the translation of the ATE datalog output data into the general ATPG datalog format with converter T2 and function module A2, at step 112. The general ATPG datalog data may then be displayed, at step 114.

The translation process continues, as shown in FIG. 5, with the further conversion of the data from the general ATPG datalog into general scan-cell failure data with converter T3, at step 116. This data may be viewed, at step 118, by the GUI 60. To ready the data for diagnosis, a fourth conversion is performed by converter T4, at step 120, thereby translating the data from general scan-cell failures to the specific EDA tool input data necessary for diagnosis.

With the data fully converted, the diagnosis tool may then be directed, at step 122, to diagnose the scan failures. Following a fifth data conversion by the diagnosis results translator 70, with T5, at step 124, the results of the diagnosis may then be viewed by a user as logical defect data, at step 126. FIGS. 5 and 6 illustrate screens showing available options and results associated with these steps as reflected in the GUI 60.

After diagnosis processing, the data may be further diagnosed or processed, as desired by the user. In some instances, the user may want to view a physical design map for the device to further understand the defects diagnosed. This may be accomplished through the use of additional software, such as that available from Knights Technologies, and known under the trademark "LogicMap" ™.

Once the diagnosis is complete, the device manufacturer may use the data to determine those steps in the manufacturing process or the device design that appear to be problematic. By correcting any deficiencies in a timely manner, the delay between device design and high-volume production may be reduced.

Those skilled in the art will appreciate the many benefits and advantages afforded by the present invention. Of significant importance is the automation capability provided by the translator modules, which serve to seamlessly convert data between the respective ATE and EDA tool domains, and the function modules, which provide automatic diagnoses of the data. This eliminates the need for costly and untimely batch processing to process data from one format to another. Further, by providing a flexible GUI that monitors all phases of the test and diagnosis, including visually illustrating failing scan chain sequences, an understanding of the failures involved may be more easily comprehended and diagnosed by the semiconductor device manufacturer.

While the invention has been particularly shown and described with reference to the preferred embodiments thereof, it will be understood by those skilled in the art that various changes in form and detail may be made therein without departing from the spirit and scope of the invention. For example, while the discussion herein is couched in terms specific to scan-based DFT methodologies, the diagnostic aspect of the invention also applies to BIST and core-test DFT methods.

What is claimed is:

1. A DFT result diagnosis system including:
   an ATE data source for providing test data in the ATE domain;
   an ATPG tool operative to generate ATPG pattern data and ATPG results data in the ATPG domain;
   at least one translation module to automatically convert data between multiple domains;
   at least one function module to automatically summarize data from one or more devices or tests in one or more domains;
   a graphical user interface generator for receiving data identifying failed scan chains and scan cells from the ATE data source and ATPG tool and generating graphical representations of the failed scan chains and cells; and
   a display device coupled to receive the graphical representations from the graphical user interface, the display device operative to display the graphical representations of the failed scan chains.

2. A DFT result diagnosis system according to claim 1 wherein:
   the ATE data source comprises a semiconductor tester.

3. A DFT result diagnosis system according to claim 1 wherein:
   the ATE data source comprises a data repository.

4. A DFT result diagnosis system according to claim 1 wherein the at least one translation module includes:
  a pattern translator to convert ATPG pattern data into ATE pattern data;
  a result translator to convert ATE output data into ATPG/diagnosis tool input data; and
  a mapping generator for correlating the pattern data and the results data between the ATPG/scan and the ATE domains.

5. A DFT result diagnosis system including:
  a test and diagnosis engine including a semiconductor tester and a scan diagnosis tool;
  a graphical user interface generator for receiving failure scan chain data identifying failed scan chains from the test and diagnosis engine and generating graphical representations of the failed scan chains; and
  a display device coupled to receive the graphical representations from the graphical user interface, the display device operative to display the graphical representations of the failed scan chains.

6. A DFT result diagnosis system according to claim 5 and further including:
  at least one translation module to automatically convert data between multiple domains; and
  at least one function module to automatically summarize data for one or more devices or tests in one or more domains.

7. A DFT result diagnosis system according to claim 6 wherein the at least one translation module includes:
  a pattern translator to convert ATPG pattern data into ATE pattern data;
  a result translator to convert ATE output data into ATPG/diagnosis tool input data; and
  a mapping generator for correlating the pattern data and the failure data between the ATPG/scan and the ATE domains.

8. A DFT result diagnosis system including:
  means for generating pattern signals in an ATE domain to test a device-under-test and producing test output data in the ATE domain;
  means for generating ATPG pattern data and ATPG results data in an ATPG domain;
  means for automatically converting data between multiple domains;
  means for automatically accumulating data for one or more devices or tests in one or more domains; and
  means for graphically displaying the failed scan chain data.

9. A computer-readable medium having stored thereon sequences of instructions which, when executed, cause one or more electronic systems to:
  capture scan failure data associated with failed scan chains from a data source;
  graphically display a portion of the scan chains including the captured failure data; and
  diagnose the scan failure data with a diagnosis tool.

10. A method comprising:
  capturing scan failure data associated with failed scan chains from a data source;
  graphically displaying a portion of the scan chains including the captured failure data; and
  diagnosing the scan failure data with a diagnosis tool to produce diagnosis results data.

11. A method according to claim 10 wherein the capturing step includes:
  testing a device-under-test with test pattern data in a scan format, the data source comprising the device-under-test.

12. A method according to claim 11 wherein the step of testing includes the step:
  directly communicating with the diagnosis tool.

13. A method according to claim 11 wherein the step of testing includes the step:
  directly communicating with the data source.

14. A method according to claim 11 wherein the step of testing includes the step:
  generating ATPG pattern data in the ATPG domain with the diagnosis tool; and
  automatically translating the ATPG pattern data into ATE test pattern data.

15. A method according to claim 11 wherein the step of capturing includes the step:
  accumulating multiple sets of scan failure data.

16. A method according to claim 11 wherein the step of displaying includes:
  displaying textual/tabular scan fail data.

* * * * *